United States Patent [19]

Kantorowicz

[11] 4,099,132
[45] Jul. 4, 1978

[54] NEGATIVE DIFFERENTIAL MOBILITY AMPLIFIER FOR A PROGRESSIVE WAVE

[75] Inventor: Gerard Kantorowicz, Paris, France
[73] Assignee: Thomson-CSF, Paris, France
[21] Appl. No.: 831,350
[22] Filed: Sep. 7, 1977
[30] Foreign Application Priority Data

Sep. 7, 1976 [FR] France .................. 76 26873

[51] Int. Cl.² .............................................. H03F 3/04
[52] U.S. Cl. ........................................ 330/5; 330/53
[58] Field of Search ............................................ 330/5

[56] References Cited
U.S. PATENT DOCUMENTS 3,833,858   9/1974   Gandhi et al. ........................ 330/5

Primary Examiner—Rudolph V. Rolinec
Assistant Examiner—Darwin R. Hostetter
Attorney, Agent, or Firm—Roland Plottel

[57] ABSTRACT

A negative differential mobility amplifier with a layer of semiconductor material of negative differential mobility. Two electrodes formed by two metallic combs are disposed on the free surface of the layer of semiconductor material. Overlapping fingers of the metallic combs are orthogonal to the propagation direction of the progressive wave and form an ohmic contact with the free surface of the semiconductor layer. The semiconductor layer is deposited onto a first surface of a dielectric substrate. A second surface of the dielectric substrate opposite to the first surface is provided with a metallic plate. The two electrodes are brought in operation to different electrical d.c. biassing potentials by a biassing source and to the high frequency potential of the progressive wave to be amplified. A line of asymetric parallel bands is formed by the metallic plate, the metallic combs, and the dielectric substrate.

13 Claims, 8 Drawing Figures

NEGATIVE DIFFERENTIAL MOBILITY AMPLIFIER FOR A PROGRESSIVE WAVE

This invention relates to a negative differential mobility amplifier for a progressive wave.

The property of amplification of a progressive wave in a medium of negative differential mobility has been described in particular in the American Journal "Proceedings of the Institute of Electrical and Electronics Engineers", Vol. 59, No. 8, 1971, pages 1155 to 1163. In certain semi-conductors, such as gallium arsenide Ga As, the differential mobility of the charge carriers and the differential resistance become negative when these materials are subjected to an electrical biassing field having a value of more than 3 kV/cm in the case of gallium arsenide. The elimination of the electrical instability source caused by the formation of regions where the electrical field is very intense and their propagation known by the name of Gunn effect provides for the amplification of electrical signals of which the frequency is such that the corresponding high frequency period is similar to the transit time of the electrons between the two biassing electrodes of the semi-conductor material or to submultiples of that transit time. The elimination of the electrical instability source is obtained for example by the choice of a semi-conductor material in which the product $n \times \overline{L}$, where $n$ is the density of free carriers in the material and $\overline{L}$ is the length of the electron path between the two electrodes, is sufficiently small, for example $n \times \overline{L}$ below $10^{12}/cm^2$.

Devices such as these have been described and produced; cf. in particular the American Journal "Proceedings of the Institute of Electrical and Electronics Engineers (Letters)" No. 63, August 1975, pages 1253 – 1254, in which a device formed by a coplanar line deposited onto a layer of n-type gallium arsenide obtained by epitaxy is capable of amplifying a wave guided along the coplanar line by transverse interaction with a flux of electrons directed between the central conductor and the lateral earth plates of the line.

Structures such as these always have the disadvantage of considerably reducing the width of the central conductor at high frequency if the desired line impedance is not to be too low because, in order to ensure the gain condition such that the transit time of the electrons is of the order of magnitude of the high frequency period, the electrodes are arranged very close together. The interval between the electrodes is less than 10 micrometers for an operating frequency of the device greater than 10 GHZ. Low-impedance devices such as these are difficult to use for the following reasons: the device is difficult to match with circuits for treating the amplified signal, the real gain of the device and the power delivered by the unmatched device are limited.

The device according to the present invention is capable of performing the same amplifying function without having any of the deficiencies referred to above.

The present invention relates to an amplifier for a progressive wave of negative differential mobility comprising a layer of semi-conductor material of negative differential mobility on the surface of which are disposed two electrodes which, in operation, are brought to different electrical d.c. potentials, said layer of semi-conductor material of negative differential mobility being deposited onto a first surface of a dielectric substrate and said electrodes being formed by two metallic combs of which the overlapping fingers, orthogonal to the direction in which the high frequency signal is propagated, form an ohmic contact with the free surface of the layer of semiconductor material, said substrate comprising on a second surface opposite to its said first surface a metallic plate which forms a line of parallel asymmetrical bands with the metallic combs which, in operation, are brought to the high frequency potential of the signal to be amplified.

The device according to the present invention enables the high frequency impedance of the amplifier to be matched irrespective of the characteristics relating to the interval between the two combs.

Devices such as these may be used for amplifying a progressive wave of very high frequency, of the order of 10 GHz, and by matching the high frequency impedance of the amplifier device enable the power output of the device to be increased and its gain to be optimised.

The invention will be better understood from the following description in conjunction with the accompanying drawings, in which the relative sizes and dimensions of the various elements have not been respected in order to make the device as a whole easier to understand.

FIG. 1b is a section on the line A–A' of FIG. 1a.

FIGS. 2b and 2c are respectively sections on the lines B—B and C—C through the particular embodiment illustrated in FIG. 2a.

FIG. 4 is a section through a variant of the embodiment illustrated in FIG. 2a.

Figure 1A:
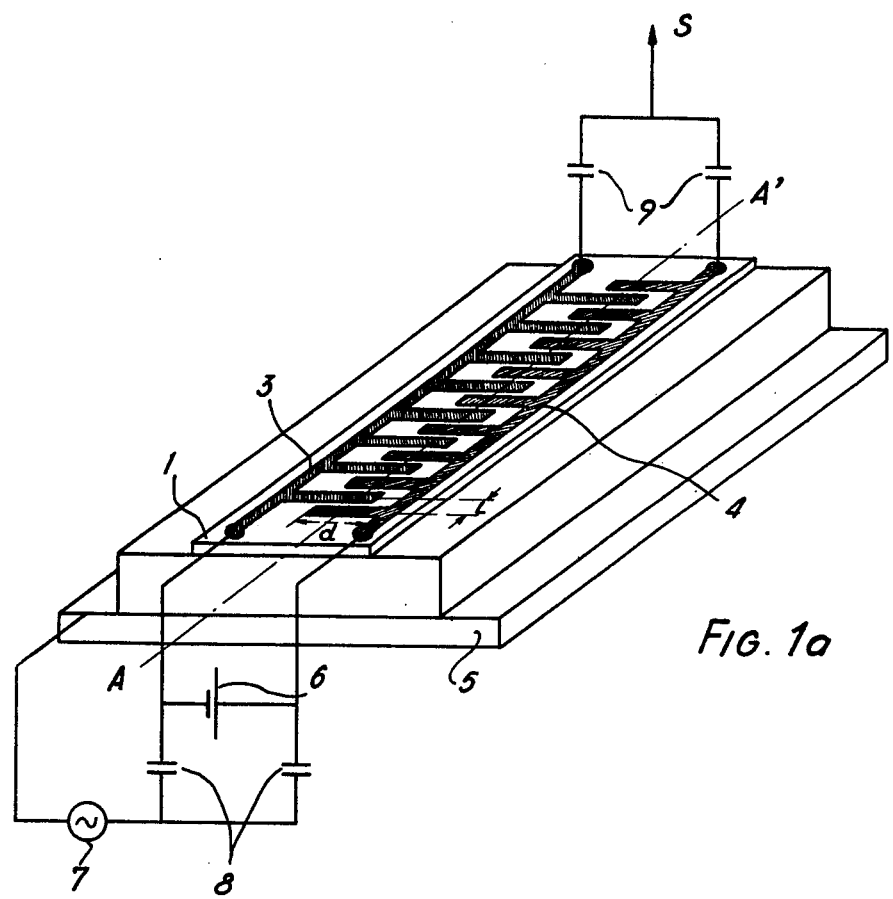
FIG. 1a shows an amplifier for a progressive wave of negative resistance according to the invention.

As shown in FIG. 1a, the amplifier according to the invention comprises a layer 1 of semiconductor material having a negative differential mobility for a biassing voltage above a threshold voltage dependent upon the type of semiconductor material used. The semiconductor material may be for example gallium arsenide Ga As of n-type conductivity to which an electrical field of greater than 3,000 volts/cm is applied. The semiconductor material used may also be indium phosphide InP to which an electrical field of greater than 10,000 volts/cm is applied. This layer 1 of semiconductor material is deposited onto a first surface of a dielectric substrate 2. This dielectric substrate 2 is advantageously formed by compensated gallium arsenide into which impurities have been introduced so as to provide the substrate with the properties of an insulating or semi-insulating dielectric.

In this case, the layer 1 of semi-conductor material is formed by n-type gallium arsenide Ga As obtained on the substrate by the known process of epitaxy. The free surface of the layer 1 of semiconductor material comprises two metallic electrodes 3 and 4 in the form of combs of which the overlapping fingers form an ohmic contact with the layer 1 of semi-conductor material. On the surface opposite its first surface, the substrate 2 comprises a metallic plate 5. The metallic plate 5 and the electrodes 3 and 4 in the form of metallic combs with overlapping fingers constitute a line of parallel asymmetrical bands known in the art as a "microstrip". In operation, the two electrodes 3 and 4 are brought to such a potential that the electrical biassing field applied by a biassing source 6 between said electrodes is above the threshold voltage of the semiconductor material in question.

The high frequency signal to be amplified is delivered to the amplifier device at the level of the comb electrodes by a generator 7 connected to the electrodes 3 and 4 by way of an input circuit 8 formed by equivalent high frequency circuits comprising two coupling capacitors. Thus, from the high frequency point of view, the two electrodes 3 and 4 are at the same potential except for the propagation term. The high frequency signal travelling in the direction AA' is amplified and delivered to an output circuit S by equivalent high frequency circuits comprising two capacitors connected to the electrodes 3 and 4.

The thickness of the layer of semiconductor material is such that, after the electrodes 3 and 4 have been biassed, the transit time of the electrons travelling from the negative electrode to the positive electrode is of the order of magnitude of the period of the high frequency signal to be amplified or of a multiple of that period, i.e.

$$\frac{L}{\overline{ve}} \# NT$$

where L is the interval separating the longitudinal plane of symmetry of two consecutive overlapping fingers and $\overline{ve}$ is the average speed of movement of the electrons in the zone of negative differential mobility.

The length d of the fingers of the combs is very much smaller than the wavelength of the high frequency signal in the amplifier device so that the assembly formed by the two combs is at the same high frequency potential for a wave travelling between the two metallic combs 3 and 4 and the metallic plate 5 forming a line of parallel asymmetrical bands.

The impedance of the device for the high frequency signals is that of the line of parallel asymmetrical bands formed by the electrodes 3 and 4 in the form of metallic combs with overlapping fingers and the metallic plate 5. This impedance is independent of the interval between the fingers of the comb. Accordingly, this impedance is capable of being adjusted, for example for matching with the outer circuit, independently of said interval determined for the amplification of a given high frequency signal. The device is reciprocal and a signal applied at 8 is amplified at 9 and vice versa.

Figure 1B:
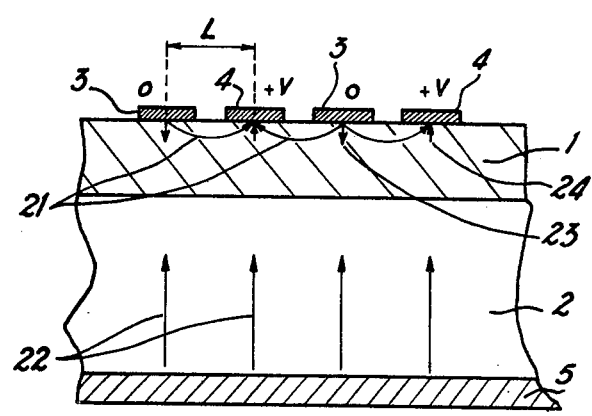

FIG. 1b is a front view of a section along the line A-A' of FIG. 1a. The same elements are denoted by the same reference numerals and the arrows 21 represent a path followed by the electrons from a negative electrode 3, taken as biassing reference and denoted O, to a positive electrode 4 denoted +V.

The arrows 22 represent at a given instant the orientation of the electrical field of the high frequency signal to be amplified travelling between the metallic plate 5 and the electrodes 3 and 4. In the dielectric substrate, this electrical field is parallel to a plane running parallel to the sectional plane A-A' of FIG. 1a. The high frequency electrical field has the same intensity for a few consecutive overlapping fingers by virtue of the fact that the spatial period of the overlapping fingers is small in relation to the wavelength of the high frequency signal in the substrate. The arrows 23 and 24 respectively represent the high frequency currents in a direction parallel to the electrical field 22 at the level of the fingers of the electrodes 3 and 4. The interaction between the high frequency currents and the electrical field of the high frequency signal at the level of the zones of the epitaxial layer 1 situated in the interval separating the fingers of the electrodes 3 and 4 and having a negative differential mobility produces the required amplification of the high frequency signal.

Figure 2A:
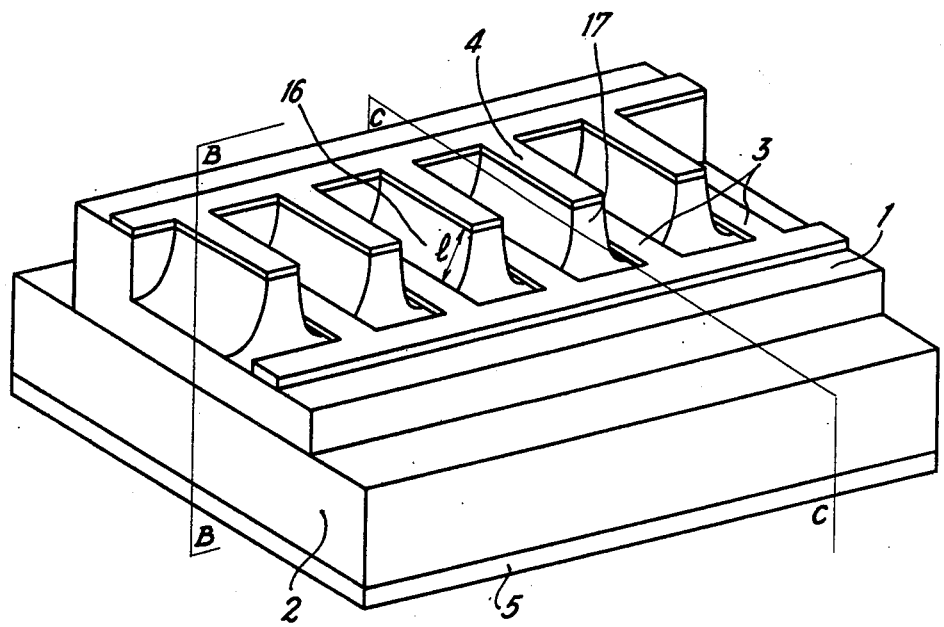
FIG. 2a is a perspective view of one particular embodiment of the invention.

The device illustrated in FIG. 2a represents a preferred embodiment of the invention by which it is possible to obtain a higher amplification gain. The device shown in FIG. 2a is such that, between two successive pairs of overlapping fingers and in a plane orthogonal to the substrate and parallel to the propagation direction of the signal to be amplified, the comb electrodes 3 and 4 show a variation in the spatial position of the interval of length l separating the opposite edges of two successive overlapping fingers, said position being defined in relation to the longitudinal plane of symmetry of said fingers. This variation in the position of the interval imparts asymmetry to the zone of negative differential mobility of the semiconductor layer 1 at the level of one of the fingers in relation to the following overlapping finger, and an asymmetry in the spatial distribution of the high frequency current in relation to the high frequency electrical field of the signal to be amplified.

The device shown in FIG. 2a comprises a layer 1 of semiconductor material, such as an epitaxial layer of n-type gallium arsenide, having a structure similar to that known in the art as a mesa structure. This layer 1 comprises a series of grooves 16 separated by lands 17. The grooves are parallel and their direction is perpendicular to the propagation direction of the high frequency signal to be amplified. In the embodiment illustrated in FIG. 2a, the fingers of the comb electrodes 3 and 4 are respectively engaged and deposited at the bottom of the grooves 16 and disposed on top of the lands 17.

The epitaxial layer 1 has a thickness substantially corresponding to the interval or spacing l between the fingers of the comb electrodes and the grooves have a depth of the order of magnitude of this length l. The width or dimension of the grooves in a direction parallel to the propagation direction of the electrical signals may be less than or greater than l.

Figure 2B:
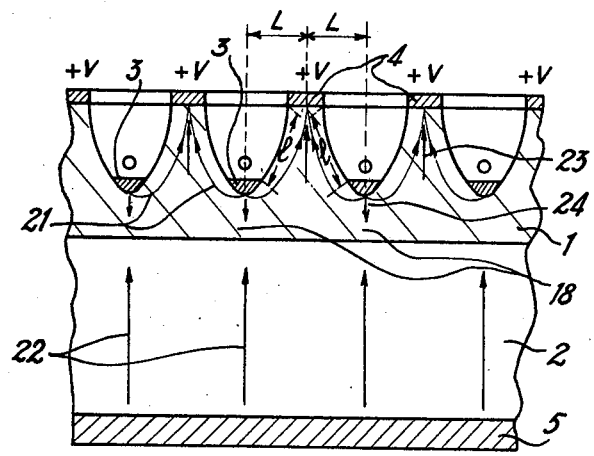

FIG. 2b is a section on the line B—B of the device illustrated in FIG. 2a. The high frequency current in a direction parallel to the electrical field of the high frequency signal 22, at the level of the electrodes 3, is very low in relation to the corresponding high frequency current at the level of the electrodes 4. This asymmetry of the high frequency currents is due to the absence of any region of negative differential mobility in the zones 18 in the immediate vicinity of the electrodes 3 and the substrate 2. This region of negative differential mobility is primarily located between the fingers of the electrodes 3 and 4 where the biassing field is maximal. The variation in the spatial position of the interval of length l corresponding to the region of negative resistance is obtained by the arrangement of said comb electrodes 3 and 4 in different parallel planes. These planes are situated in the layer 1 of semiconductor material. In the embodiment illustrated in FIGS. 2a and 2b, these planes are parallel to a reference plane of the device formed by the metallic plate 5. However, the separate parallel planes may have a predetermined inclination in relation to the plane containing the metallic plate 5 in the case where a progressive variation is required in the high frequency impedance of the line of parallel bands, as will be explained in detail hereinafter.

In the embodiment illustrated in FIGS. 2a and 2b, the planes containing the electrodes 3 and 4 have a different elevation in relation to the reference plane. The effect of this difference in elevation is to localise the zone of negative differential mobility, which is the seat of amplification, between two consecutive overlapping fingers and, in particular, in the lands 17 supporting the fingers of the electrode 4. The corresponding relative attenuation of the high frequency currents at the level of the fingers of the electrode 3 produces a global increase in the gain of the device.

Figure 2C:
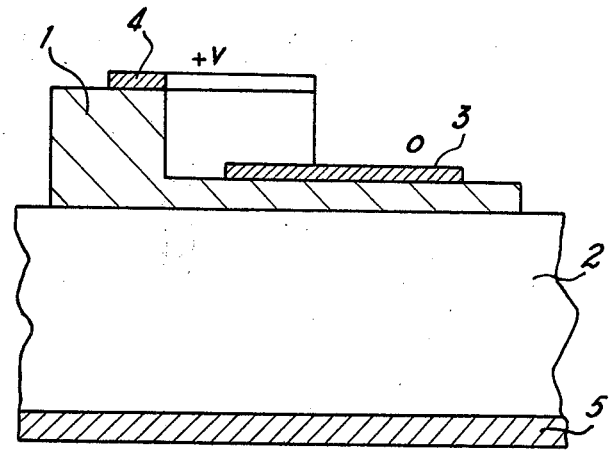

FIG. 2c is a section on the line C—C through the device illustrated in FIG. 2a and shows the arrangement of the electrodes 3 and 4 in the grooves and on top of the lands.

Figure 3:
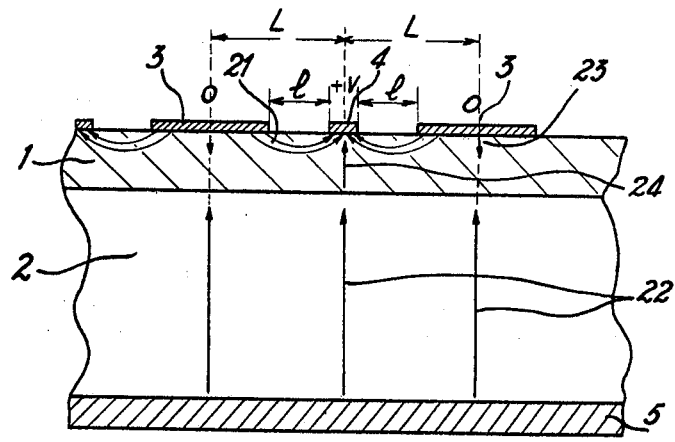
FIG. 3 is a section through an embodiment of the invention taken along a plane parallel to the direction of the signal to be amplified.

FIG. 3 is a section taken in a direction parallel to the propagation direction of the high frequency signal through another particular embodiment of the invention. In this device, the asymmetry in the spatial distribution of the high frequency current in relation to the electrical field of the signal is obtained by a variation in the width or dimension in the propagation direction of the high frequency signal of two consecutive overlapping fingers. This variation or modification in the width of two consecutive overlapping fingers produces a variation or modification in the spatial position of the interval of length $l$ separating two consecutive overlapping fingers, the interval of length $l$ for two pairs of successive overlapping fingers being staggered in the propagation direction of the signal to be amplified in relation to the longitudinal plane of symmetry of said fingers. The fingers of one of the electrodes, the electrode 3 in the case of FIG. 3, have a width greater than the corresponding width of the fingers of the associated electrode, the electrode 4. The ratio between the widths of the overlapping fingers is for example 4 to 5. In the zone situated between the fingers of large width 3 and the substrate 2, the high frequency current 23 in a direction parallel to the electrical field of the high frequency signal is small in relation to the high frequency current 24 at the level of the electrode of small width 4 due to the localisation of the zones or regions of negative differential mobility of the epitaxial layer 1 between the fingers of the electrodes 3 and 4. The relative attenuation of the high frequency currents at the level of the electrodes of large width produces a global increase in the gain of the device.

Commensurately with the amplification of the progressive wave or high frequency signal, it is possible to modify the high-frequency impedance of the line of asymmetrical parallel bands in order progressively to reduce it so as to diminish the saturation phenomena and to increase the efficiency of interaction.

This reduction in impedance is obtained for example by increasing the length $d$ of the fingers of the combs or by progressively reducing the thickness of the semi-insulating substrate 2 acting as a dielectric support for the line of asymmetrical bands.

Figure 4:
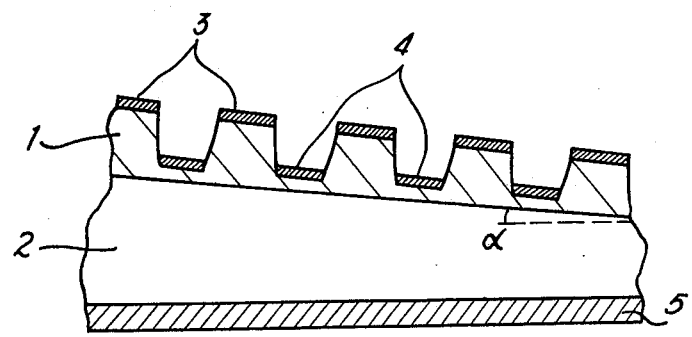

According to FIG. 4, the amplifier according to the invention also comprises two metallic electrodes 3,4 in the form of combs having overlapping fingers. These electrodes 3, 4 are situated in the layer 1 of semiconductor material in separate parallel planes. These planes are inclined relative to the reference plane formed by the plate 5 by a predetermined angle $\alpha$. This angle $\alpha$ depends upon the required impedance modification or upon the external impedance to which the amplifier device is to be matched.

Figure 5:
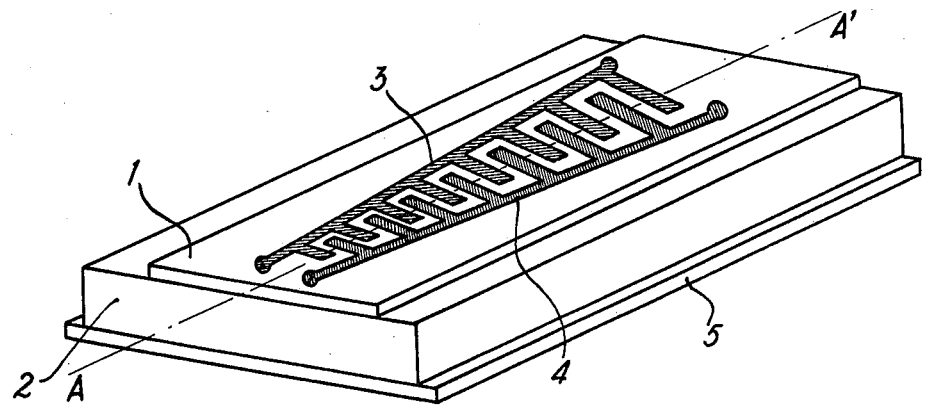
FIG. 5 shows another variant of the device according to the invention.

In the embodiment illustrated in FIG. 5, the progressive modification of the high frequency impedance of the line is obtained by increasing the length of each finger of the comb. The increase in the length $d$ of the fingers of the comb may be utilised for any of the devices shown in FIGS. 1a, 2a and 3.

With regard to the arrangement of the comb electrodes on the surface of the epitaxial layer 1, the various embodiments described in the foregoing may be obtained by the conventional processes of masking and evaporation in vacuo, photolithography and chemical etching.

Of course, the invention is not limited to the embodiments described and shown, which are given solely by way of example.

What is claimed is:

1. An amplifier for a high frequency progressive wave comprising:
   a layer of semiconductor material of negative differential mobility,
   two electrodes formed by two metallic combs of which the overlapping fingers are orthogonal to the propagation direction of the high frequency progressive wave, said two electrodes disposed on the free surface of said layer of semiconductor material and said overlapping fingers forming an ohmic contact with the free surface of the semiconductor layer,
   a biassing source bringing in operation said two electrodes to different electrical d.c. biassing potentials,
   a dielectric substrate with a first surface and a second surface opposite to said first surface, said layer of semiconductor material being deposited onto said first surface of the dielectric substrate and said second surface comprising a metallic plate, said metallic plate metallic combs and dielectric substrate forming a line of asymetric parallel bands the metallic combs being brought in operation to the high frequency potential of the progressive wave to be amplified.

2. An amplifier as claimed in claim 1 wherein two consecutive overlapping fingers are separated, between their planes of longitudinal symmetry, by an interval of length L such that the transit time of the electrons between the two fingers is similar to the period of the high frequency progressive wave to be amplified.

3. An amplifier as claimed in claim 1 wherein two consecutive overlapping fingers are separated between their planes of longitudinal symmetry, by an interval of length L such that the transit time of the electrons between the two fingers is similar to a multiple of the period of the high frequency progressive wave to be amplified.

4. An amplifier as claimed in claim 1 wherein said layer of semiconductor material is an epitaxial layer of n-type gallium arsenide Ga As.

5. An amplifier as claimed in claim 1 wherein said layer of semiconductor material is an epitaxial layer of n-type of indium phosphide InP.

6. An amplifier as claimed in claim 1 wherein said dielectric substrate is semi-insulating gallium arsenide Ga As.

7. An amplifier as claimed in claim 2 wherein, between two pairs of successive overlapping fingers and in a plane orthogonal to the substrate and parallel to the propagation direction of the progressive wave to be amplified, the comb electrodes show a variation in the spatial position of the interval of length $l$ separating the opposite edges of two successive overlapping fingers, said spatial position being defined in relation to the longitudinal plane of symmetry of said fingers, said position variation imparting asymmetry to the zone of negative differential mobility of the layer of semiconductor material at the level of one of the fingers in relation to the following finger.

8. An amplifier as claimed in claim 7 wherein said variation in the spatial position of the interval of length $l$ is obtained by arranging said comb electrodes in separate parallel planes situated in the layer of semiconductor material.

9. An amplifier as claimed in claim 8 wherein the layer of semiconductor material is a mesa structure comprising a series of grooves separated by lands, said grooves being orthogonal to the propagation direction of the high frequency progressive wave to be amplified and said comb electrodes having their fingers respectively engaged and deposited at the bottom of the grooves and disposed on top of the lands.

10. An amplifier as claimed in claim 8 wherein said separate parallel planes containing the electrodes are inclined by a predetermined angle $\alpha$ in relation to a reference plane of the device such as the plane containing the metallic plate.

11. An amplifier as claimed in claim 7 wherein two successive overlapping fingers of the electrodes separated by an interval of length L between their longitudinal planex of symetry have different widths.

12. An amplifier as claimed in claim 11 wherein the ratio between the width of two successive overlapping fingers has a value of 4 to 5.

13. An amplifier as claimed in claim 11 wherein two succssive overlapping fingers of the electrodes have an increasing length.

* * * * *